US009214505B2

(12) United States Patent
Higo et al.

(10) Patent No.: US 9,214,505 B2
(45) Date of Patent: Dec. 15, 2015

(54) DISPLAY AND ELECTRONIC UNIT

(75) Inventors: Tomoyuki Higo, Tokyo (JP); Tadahiko Yoshinaga, Kanagawa (JP)

(73) Assignee: JOLED INC., Tokyo (JP)

(*) Notice: Subject to any disclaimer, the term of this patent is extended or adjusted under 35 U.S.C. 154(b) by 0 days.

(21) Appl. No.: 13/600,668

(22) Filed: Aug. 31, 2012

(65) Prior Publication Data

US 2013/0062635 A1 Mar. 14, 2013

(30) Foreign Application Priority Data

Sep. 9, 2011 (JP) ................................. 2011-196738

(51) Int. Cl.
*H01L 27/32* (2006.01)
*G09G 3/32* (2006.01)

(52) U.S. Cl.
CPC ............ *H01L 27/326* (2013.01); *G09G 3/3225* (2013.01); *H01L 27/3248* (2013.01); *H01L 27/3258* (2013.01); *H01L 2227/323* (2013.01)

(58) Field of Classification Search
CPC .............. H01L 27/326; H01L 27/3248; H01L 51/5206; H01L 27/3258; H01L 2227/323; G09G 3/3225
USPC .............................. 257/59, 72; 438/30, 82, 99
See application file for complete search history.

(56) References Cited

U.S. PATENT DOCUMENTS

2008/0218071 A1* 9/2008 Kobayashi .................... 313/506
2011/0193476 A1* 8/2011 Higo et al. .................... 313/504

FOREIGN PATENT DOCUMENTS

JP 2006-269253 10/2006
JP 2009-146885 7/2009

* cited by examiner

*Primary Examiner* — Kyoung Lee
*Assistant Examiner* — Ratisha Mehta
(74) *Attorney, Agent, or Firm* — Sheridan Ross P.C.

(57) ABSTRACT

A display includes: a first region including first pixels configured of a single color; a second region including second pixels configured of a plurality of colors different from the single color, the second pixels having an organic layer including a common light emitting layer; and a dividing wall separating the first region from the second region.

19 Claims, 13 Drawing Sheets

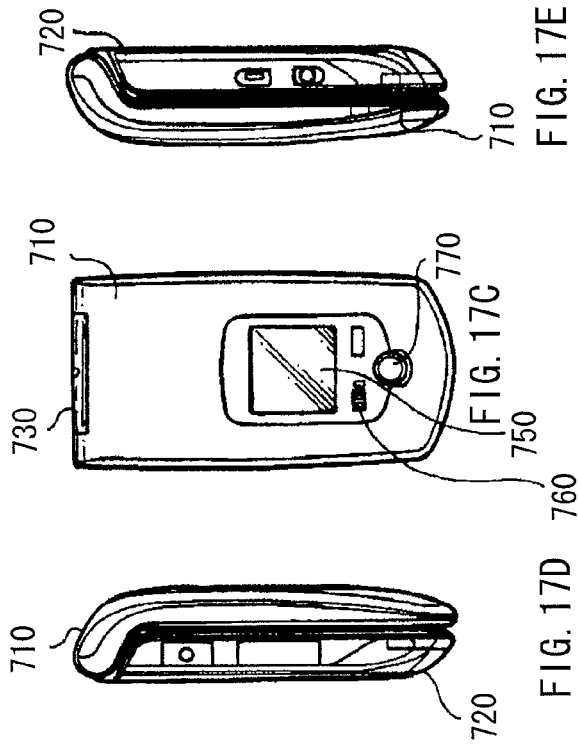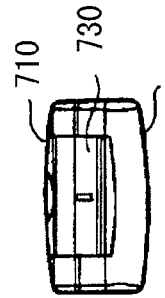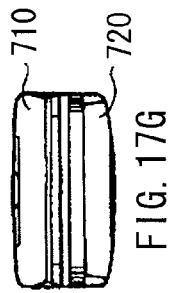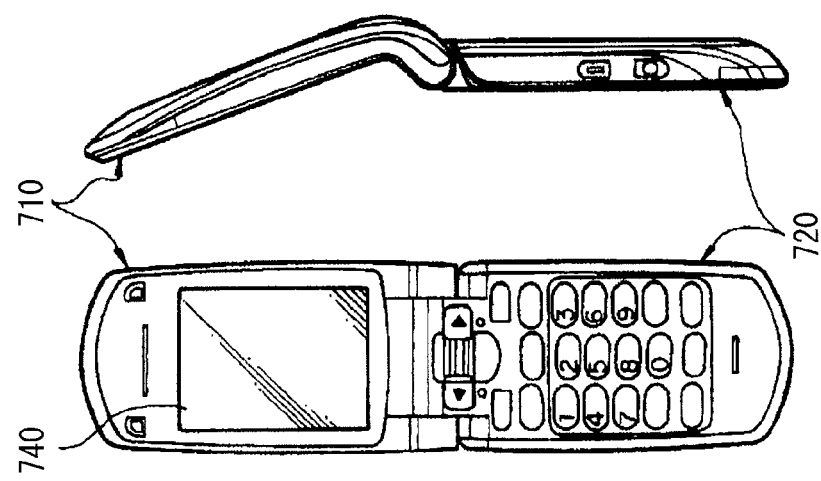

DISPLAY AND ELECTRONIC UNIT

BACKGROUND

The present disclosure relates to a display that emits light by utilizing organic electroluminescence (EL) phenomenon and to an electronic unit that includes the display.

As development of information and communications industry has been accelerated, a display device having high performance has been demanded. Specially, an organic EL device that has attracted attentions as a next generation display device has an advantage that the view angle is wide, the contrast is excellent, and the response time is short as a self-luminous display.

Materials used for a light emitting layer and the like forming the organic EL device are broadly classified into a low molecular material and a polymer material. In general, it is known that the low molecular material provides higher light emission efficiency and a longer life. In particular, performance of blue light emission in the case of using the low molecular material is high.

Further, in the case of using the low molecular material, in general, the organic film is formed by a dry method (evaporation method) such as a vacuum evaporation method. Meanwhile, in the case of using the polymer material, in general, the organic film is formed by a wet method (coating method) such as a spin coating method, an ink jet method, and a nozzle coating method or a printing method such as a flexo printing and offset printing.

The vacuum evaporation method has an advantage that a formation material of the organic thin film is not necessarily dissolved in a solvent, and a step of removing the solvent after forming the film is not necessitated. However, the vacuum evaporation method has disadvantages as follows. That is, separate coating by a metal mask is difficult, and facility manufacturing cost particularly in preparing a large panel is high. Therefore, the vacuum evaporation method is difficult to be applied to a large screen substrate, and is not suitable for mass production. Therefore, the coating method by which a large display screen area is comparatively easily realized has attracted attentions.

In the case where the coating method is used, however, in drying ink with which a space between pixels separated by a dividing wall is coated, the ink creeps up along the dividing wall resulting in wetting, and accordingly the aperture ratio is significantly lowered. Further, in the case where the pixel width is decreased to realize high resolution, it is difficult to coat a desired location with liquid droplets.

To resolve the foregoing disadvantages, for example, in Japanese Unexamined Patent Application Publication No. 2009-146885, as a method of suppressing film thickness unevenness caused by wetting and/or the like, a method of forming a dummy pixel region around an effective pixel region, and processing the shape of an insulating film in the vicinity of a lower electrode is disclosed. Further, as a method of obtaining a high-resolution display, for example, in Japanese Unexamined Patent Application Publication No. 2006-269253, a full-color display in which high resolution is achieved by forming a white pixel by coating the whole surface of a display region and using color filters of red (R), green (G), and blue (B) is disclosed.

SUMMARY

However, in the display having the configuration disclosed in Japanese Unexamined Patent Application Publication No. 2009-146885, since R and G should be patterned at least, wetting occurs in a red pixel and a green pixel, and the aperture ratio is not sufficiently improved. Further, in the display having the configuration disclosed in Japanese Unexamined Patent Application Publication No. 2006-269253, though the aperture ratio is secured, reliability is lowered due to high load resulting from increased electric power consumption.

It is desirable to provide a display in which the aperture ratio is improved and an electronic unit including the same.

According to an embodiment of the present disclosure, there is provided a display including: a first region including first pixels configured of a single color; a second region including second pixels configured of a plurality of colors different from the single color, the second pixels having an organic layer including a common light emitting layer; and a dividing wall separating the first region from the second region.

According to an embodiment of the present disclosure, there is provided an electronic unit including a display, the display including: a first region including first pixels configured of a single color; a second region including second pixels configured of a plurality of colors different from the single color, the second pixels having an organic layer including a common light emitting layer; and a dividing wall separating the first region from the second region.

In the display and the electronic unit according to the embodiments of the present disclosure, the dividing wall is provided between the first region including the first pixels configured of the single color and the second region including the second pixels configured of the plurality of colors different from the single color, the dividing wall is not provided in the second region, and the organic layer including the light emitting layer common to the second pixels included in the second region. Thereby, thickening of the organic layer in the pixel region due to wetting in the dividing wall is decreased.

According to the display and the electronic unit according to the embodiments of the present disclosure, the dividing wall is not provided in the second region including the second pixels of the plurality of colors, and the organic layer including the light emitting layer common to the second pixels included in the second region. Therefore, thickening of the organic layer (in particular, the light emitting layer) in the pixel region due to wetting in the dividing wall is decreased, and the effective pixel region is widened. Accordingly, the aperture ratio of the pixels is improved.

It is to be understood that both the foregoing general description and the following detailed description are exemplary, and are intended to provide further explanation of the technology as claimed.

BRIEF DESCRIPTION OF THE DRAWINGS

The accompanying drawings are included to provide a further understanding of the disclosure, and are incorporated in and constitute a part of this specification. The drawings illustrate embodiments and, together with the specification, serve to explain the principles of the technology.

FIG. 12 is a plan view illustrating a schematic configuration of a module including the display according to the foregoing embodiment and the like.

FIG. 17A is an elevation view of an application example 5 unclosed, FIG. 17B is a side view thereof, FIG. 17C is an elevation view of the application example 5 closed, FIG. 17D is a left side view thereof, FIG. 17E is a right side view thereof, FIG. 17F is a top view thereof, and FIG. 17G is a bottom view thereof.

DETAILED DESCRIPTION

Embodiments of the present disclosure will be hereinafter described in detail with reference to the drawings. The description will be given in the following order:
1. First Embodiment (a display having a first lyophilic region and a first liquid-repellent region in a display region and having a second lyophilic region in a peripheral region)
1-1. Configuration of Display Region
1-2. Whole Configuration of Display
2. Modification (a display in which the film thicknesses of an organic layer are different according to a light emission color)
3. Application examples

1. First Embodiment

1-1. Configuration of Display Region

Figure 1:
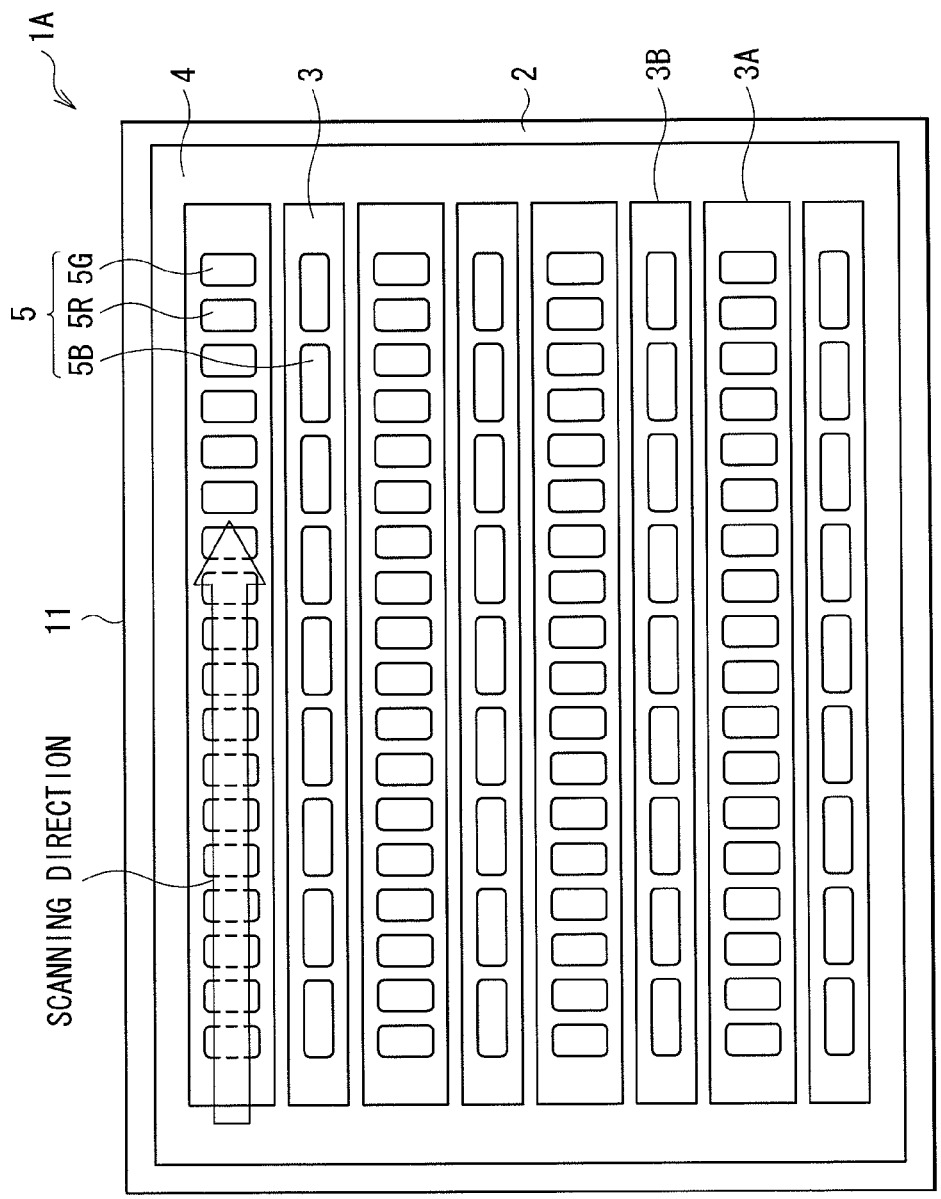
FIG. 1 is a plan view illustrating an example of a configuration of a display according to a first embodiment of the present disclosure.
Figure 2:
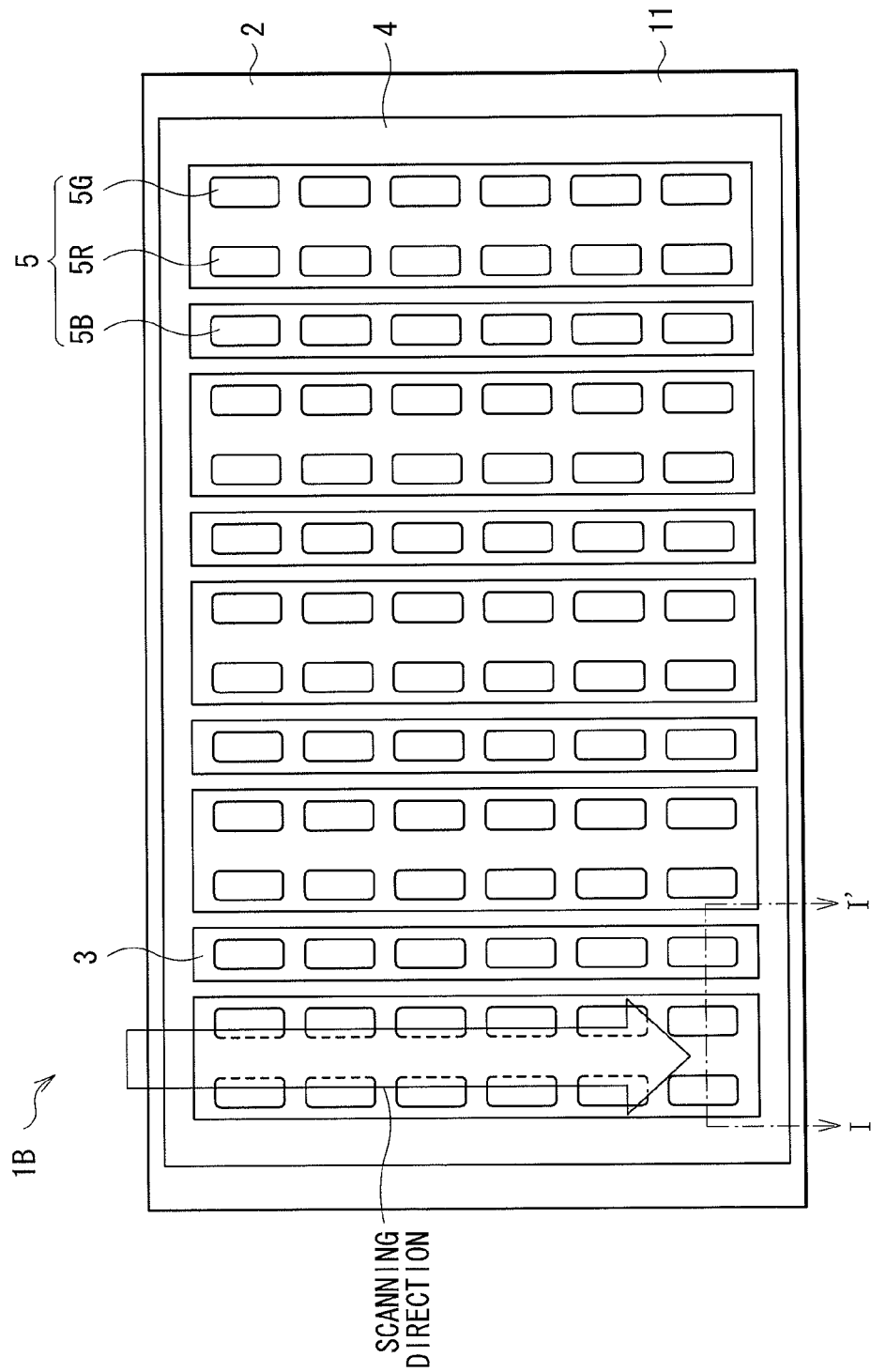
FIG. 2 is a plan view illustrating another example of the configuration of the display according to the first embodiment of the present disclosure.

FIG. 1 illustrates a planar configuration of a display region 2 in a display 1A according to a first embodiment of the present disclosure. In the display region 2 of the display 1A, for example, a plurality of pixels 5 are arranged on a substrate 11. The plurality of pixels 5 include, for example, a red pixel 5R, a green pixel 5G, and a blue pixel 5B. In this case, a combination of the red pixel 5R, the green pixel 5G, and the blue pixel 5B forms one display pixel. The red pixels 5R, the green pixels 5G, and the blue pixels 5B are arranged in a state of matrix. Specifically, for example, as illustrated in FIG. 1, the red pixels 5R and the green pixels 5G are alternately arranged and are provided linearly so that longitudinal directions of the pixels 5 having a rectangular shape are adjacent to each other. The blue pixels 5B are arranged so that shorter-side directions thereof are adjacent to each other along the extending direction of the red pixels 5R and the green pixels 5G. Arrangement method of the respective pixels 5 (5R, 5G, and 5B) is not limited thereto. For example, as illustrated in FIG. 2, the red pixels 5R, the green pixels 5G, and the blue pixels 5B may be linearly arranged separately by color so that shorter-side directions thereof are adjacent to each other. Further, the respective pixels 5 (5R, 5G, and 5B) are provided with organic EL devices 10 (10R, 10G, and 10B, see FIG. 6) of each corresponding color.

In the display region 2 of the display 1A according to this embodiment, a lyophilic region 3 and a liquid-repellent region 4 are provided. The lyophilic region 3 is provided on the periphery of the respective pixels 5 (5R, 5G, and 5B). The liquid-repellent region 4 is formed to separate an RG region 3A (second region) in which the red pixels 5R and the green pixels 5G are alternately arranged from a B region 3B (first region) in which the blue pixels 5B are arranged, and to surround the whole pixels 5. Both the lyophilic region 3 and the liquid-repellent region 4 have a function as a bank of ink discharged in forming the organic EL device 10 by coating. By providing the lyophilic regions 3 separated by the liquid-repellent region 4, a desired pixel pattern is formed.

The lyophilic region 3 improves wettability of the ink, and is continuously provided in the display region 2 to define the shapes of the pixels 5R, 5G, and 5B. As a material of the lyophilic region 3, an inorganic material such as silicon dioxide ($SiO_2$), silicon carbide (SiC), silicon nitride ($Si_3N_4$), an indium tin oxide (ITO), an indium zinc oxide (IZO), aluminum (Al), titanium (Ti), and molybdenum (Mo) is used. The lyophilic region 3 is formed by a vacuum evaporation method, a CVD (chemical vapor deposition) method, a PVD (physical vapor deposition) method, or the like.

The liquid-repellent region 4 prevents excessive wetting of the ink discharged to the RG region 3A and the B region 3B, specifically to prevent intrusion of ink into an adjacent pixel line. Further, as described above, the liquid-repellent region 4 is provided to separate the RG region 3A in which the red pixels 5R and the green pixels 5G are alternately arranged from the B region 3B in which the blue pixels 5B are arranged, and to surround the whole pixels 5. Examples of a material of the liquid-repellent region 4 include an organic material such as polyimide and novolac. After such a material is formed in a predetermined shape, plasma treatment is performed thereon to add liquid repellency thereto.

Though not herein illustrated, a peripheral region 6, (see FIG. 3) is provided on the periphery of the display region 2. In the peripheral region 6, a lyophilic region (not illustrated) is fully provided. By providing the lyophilic region to improve wettability of the peripheral region 6, a liquid pool (bead) in discharging the ink to the respective pixel lines (the RG region 3A and the B region 3B) is easily formed. Thereby, the ink is allowed to be discharged continuously onto the pixel lines. It is to be noted that the lyophilic region of the peripheral region 6 is not limited thereto. For the after-mentioned reason, it is enough that the lyophilic region of the peripheral region 6 is provided on one end side in the extending direction of the RG region 3A and the B region 3B at minimum, specifically in a region where the bead is formed at the time of starting ink coating. However, in some cases, providing the lyophilic region on both ends and forming a symmetrical pattern leads to an advantageous state in manufacturing steps on and after forming the organic layer 15. It is to be noted that the lyophilic region of the peripheral region 6 is made of the same material as that of the foregoing lyophilic region 3, and is formed by the same method as that of the foregoing lyophilic region 3.

As described above, over the respective pixels 5R, 5G, and 5B of the display region 2, the organic EL devices 10 (10R, 10G, and 10B) of each color corresponding to the respective pixels 5R, 5G, and 5B are provided. Though a description will be given in detail later, the organic EL device 10 has a configuration in which a lower electrode 12 (first electrode), a liquid-repellent layer (dividing wall) 14, an organic layer 15, and an upper electrode 16 (second electrode) are layered in this order (see FIG. 6). Of the foregoing, part of the organic layer 15 (specifically, a yellow light emitting layer 15CY) is formed by a coating method such as a droplet discharge method. Specifically, an ink in which an organic material forming the organic layer 15 is dissolved in an organic solvent is discharged from a plurality of discharge outlets provided in a head of a slit coater (or a stripe coater) to the respective pixel lines (the RG region 3A and the B region 3B) in which the respective pixels 5R, 5G, and 5B are arranged. After that, by heating the resultant, the solvent is removed to form the respective layers.

Figure 3A:
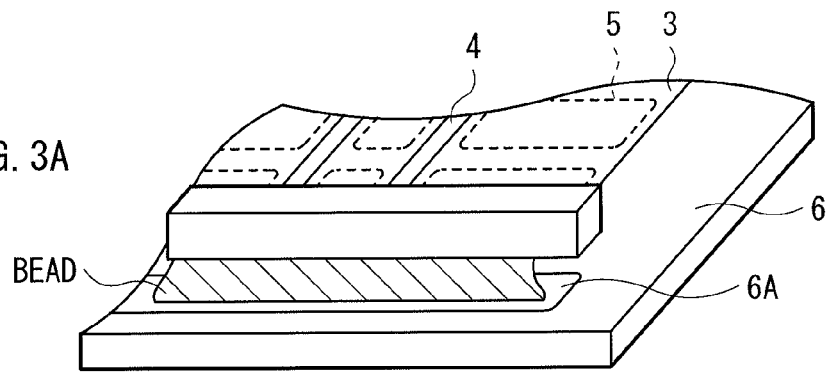
FIGS. 3A to 3C are schematic views explaining a method of coating an organic layer in the display illustrated in FIG. 1.
Figure 3B:
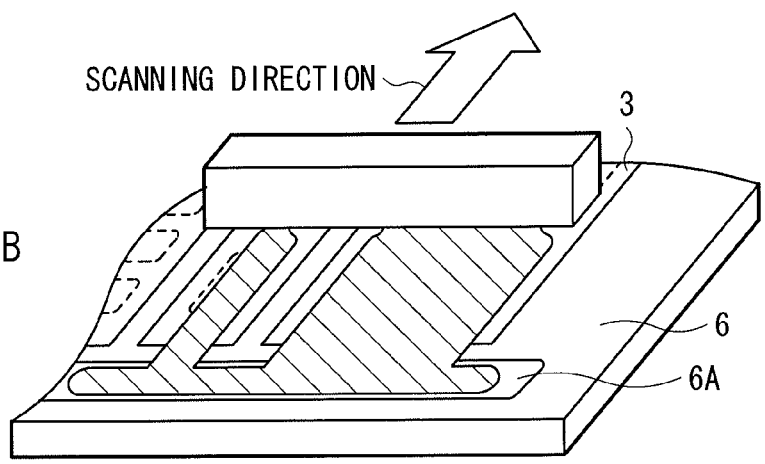
Figure 3C:
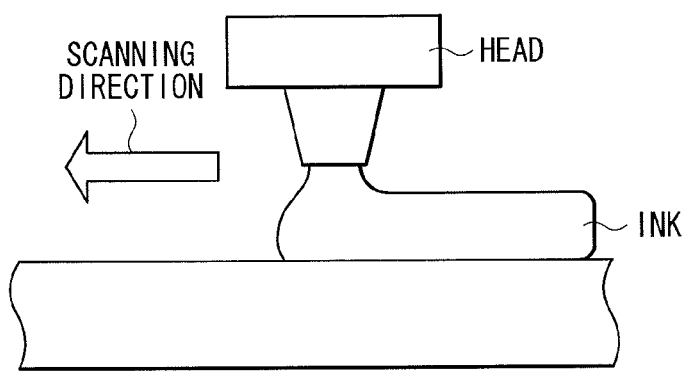

The organic layer 15 is formed as follows. First, as illustrated in FIG. 3A, the ink is discharged from the discharge outlet of the head of the slit coater to outside of the liquid-repellent region 4, in particular, to the peripheral region 6 on one end side in the extending direction of the respective pixel lines to form a bead so that the head is in contact with a substrate 11 with the ink in between. Thereby, the wettability of the head surface is uniformalized. Next, as illustrated in FIG. 3B, scanning is performed along the pixel lines, and the ink is discharged onto the pixels 5. At this time, as illustrated in FIG. 3C, the head is moved in the scanning direction while a state that the head is in contact with the substrate 11 with the ink in between is retained.

In forming the organic layer 15 by the coating method as described above, the foregoing formation of the bead is important. Therefore, in the peripheral region 6 surrounding the display region 2, as described above, the lyophilic region is desirably provided in the region where the bead is formed at minimum. Thereby, disconnection between the ink and the substrate 11 due to surface tension of the ink, liquid repellency of the substrate 11, and/or the like is suppressed, and connection between the ink and the substrate 11 is easily retained. That is, the organic layer 15 in the respective pixels 5R, 5G, and 5B is accurately formed by coating.

1-2. Whole Configuration of Display

Figure 4:
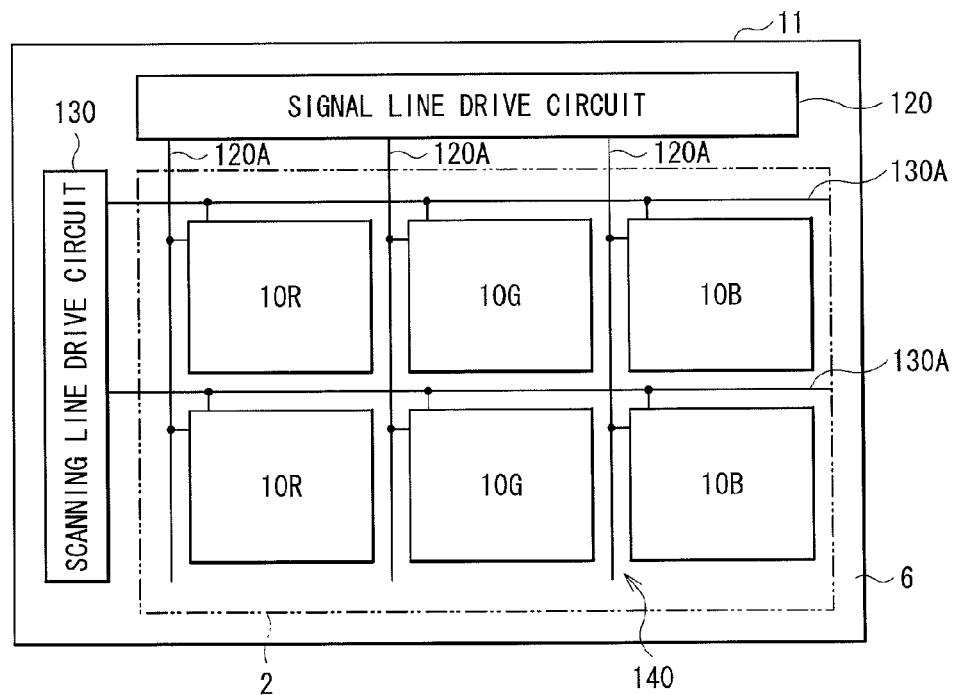
FIG. 4 is a diagrammatic illustration of the display illustrated in FIG. 1.

Next, a description will be given of the cross-sectional configuration of the display 1A. FIG. 4 illustrates a schematic configuration of the display 1A according to this embodiment. The display 1A is used as an organic EL television or the like. As described above, in the display 1A, the display region 2 in which the plurality of organic EL devices 10R, 10G, and 10B are arranged in a matrix state is formed on the substrate 11, and the peripheral region 6 is arranged to surround the display region 2. In the peripheral region 6, a signal line drive circuit 120 and a scanning line drive circuit 130 that are drivers for displaying an image are provided.

Figure 5:
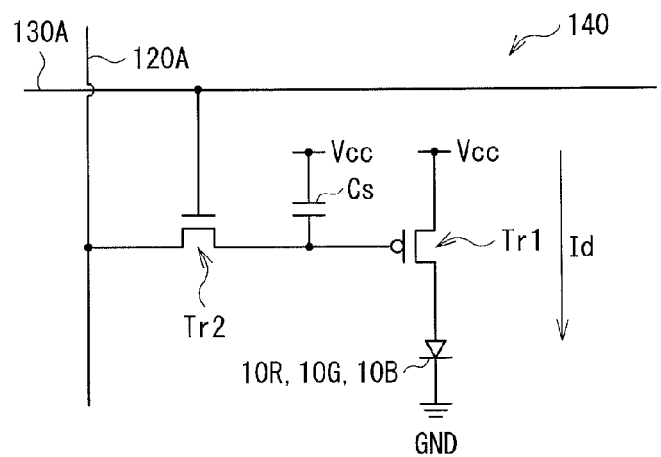
FIG. 5 is a diagram illustrating an example of a pixel drive circuit of the display illustrated in FIG. 4.

In the display region 2, a pixel drive circuit 140 is provided. FIG. 5 illustrates an example of the pixel drive circuit 140. The pixel drive circuit 140 is an active drive circuit that is formed in a layer located lower than an after-mentioned lower electrode 12. That is, the pixel drive circuit 140 has a drive transistor Tr1, a writing transistor Tr2, a capacitor (retentive capacity) Cs between the transistors Tr1 and Tr2, the red organic EL device 10R (or the green organic EL device 10G or the blue organic EL device 10B) serially connected to the drive transistor Tr1 between a first power line (Vcc) and a second power line (GND). The drive transistor Tr1 and the writing transistor Tr2 are formed of a general thin film transistor (TFT). The configuration thereof is not particularly limited, and may be, for example, inversely-staggered structure (so-called bottom gate type) or staggered structure (top gate type).

In the pixel drive circuit 140, a plurality of signal lines 120A are arranged in the column direction, and a plurality of scanning lines 130A are arranged in the row direction. Each intersection of each signal line 120A and each scanning line 130A corresponds to one of the red organic EL device 10R, the green organic EL device 10G, and the blue organic EL device 10B. Each signal line 120A is connected to the signal line drive circuit 120. An image signal is supplied to a source electrode of the writing transistor Tr2 from the signal line drive circuit 120 through the signal line 120A. Each scanning line 130A is connected to the scanning line drive circuit 130. A scanning signal is sequentially supplied to a gate electrode of the writing transistor Tr2 from the scanning line drive circuit 130 through the scanning line 130A.

Figure 6:
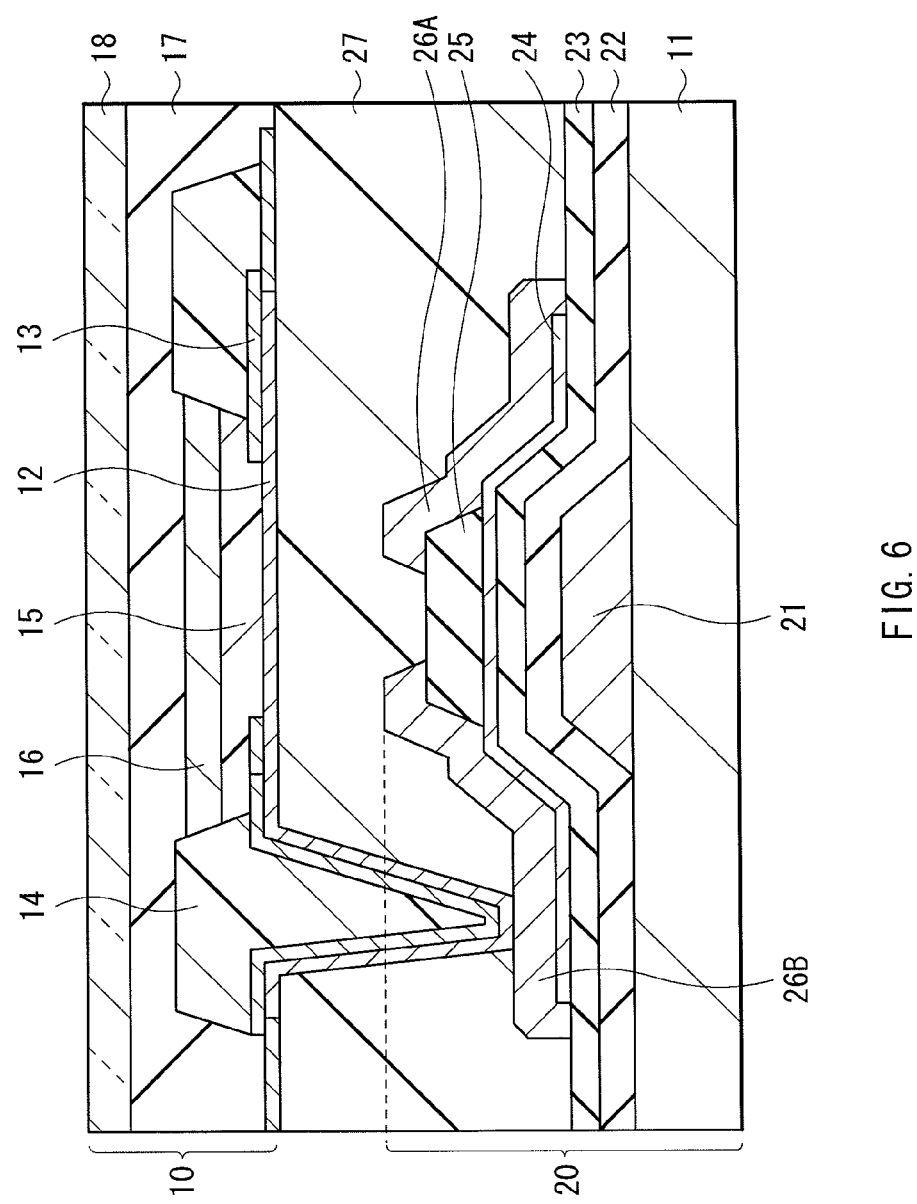
FIG. 6 is a cross-sectional view of part of the display illustrated in FIG. 1.

FIG. 6 illustrates a cross-sectional configuration of part of the display 1A and a display 1B. The display 1A is provided with a TFT 20 driving the pixel 5 by, for example, an active matrix method on the substrate 11. On the TFT 20, the organic EL devices 10 (10R, 10G, and 10B) configuring the pixels 5 (5R, 5G, and 5B) are provided.

[TFT]

The TFT 20 is, what we call a bottom gate type TFT, in which, for example, oxide semiconductor is used for a channel (active layer). In the TFT 20, on the substrate 11 made of glass and/or the like, a gate electrode 21, gate insulating films 22 and 23, an oxide semiconductor layer 24, a channel protective film 25, and a pair of a source electrode 26A and a drain electrode 26B are formed in this order. On the source electrode 26A and the drain electrode 26B, a planarizing layer 27 for planarizing concavity and convexity of the TFT 20 is formed over the whole surface of the substrate 11.

The gate electrode 21 plays the role of controlling carrier density (in this case, electron density) in the oxide semiconductor layer 24 by a gate voltage applied to the TFT 20. The gate electrode 21 is formed of a single layer film made of, for example, one of Mo, Al, an aluminum alloy, and the like, or a laminated film formed of two or more thereof. It is to be noted that examples of the aluminum alloy include an aluminum-neodymium alloy.

The gate insulating films 22 and 23 are single-layer films made of one of $SiO_2$, $Si_3N_4$, a silicon nitride oxide (SiON), aluminum oxide ($Al_2O_3$), and the like, or laminated films formed of two or more thereof. In this case, the gate insulating films 22 and 23 have a two-layer film structure. The gate insulating film 22 is made of, for example, an $SiO_2$ film, and the gate insulating film 23 is made of, for example, an $Si_3N_4$ film. The total film thickness of the gate insulating films 22 and 23 is, for example, from 200 nm to 300 nm both inclusive.

The oxide semiconductor layer 24 contains an oxide of one or more of indium (In), gallium (Ga), zinc (Zn), tin (Sn), Al, and Ti as a main component. The oxide semiconductor layer 24 forms a channel between the source electrode 26A and the drain electrode 26B by applying a gate voltage. The film thickness of the oxide semiconductor layer 24 is, for example, from 5 nm to 100 nm both inclusive.

The channel protective film 25 is formed on the oxide semiconductor layer 24, and prevents damage of the channel at the time of forming the source electrode 26A and the drain electrode 26B. The film thickness of the channel protective film 25 is, for example, from 10 nm to 300 nm both inclusive.

The source electrode 26A and the drain electrode 26B each are, for example, a single-layer film made of one of Mo, Al, copper (Cu), Ti, ITO, TiO, and the like, or laminated films formed of two or more thereof. For example, a three-layer film in which Mo, Al, and Mo having a film thickness of 50 nm, 500 nm, and 50 nm, respectively, are sequentially layered is desirably used, or a metal or a metal compound weakly combined with oxygen such as a metal compound containing oxygen such as ITO and a titanium oxide is desirably used. Thereby, electric characteristics of the oxide semiconductor are stably retained.

For the planarizing layer 27, for example, an organic material such as polyimide and novolac is used. The thickness of the planarizing layer 27 is, for example, from 10 nm to 100 nm both inclusive, and is preferably equal to or less than 50 nm. On the planarizing layer 27, the lower electrode 12 of the organic EL device 10 is formed.

[Organic EL Device]

Figure 7A:
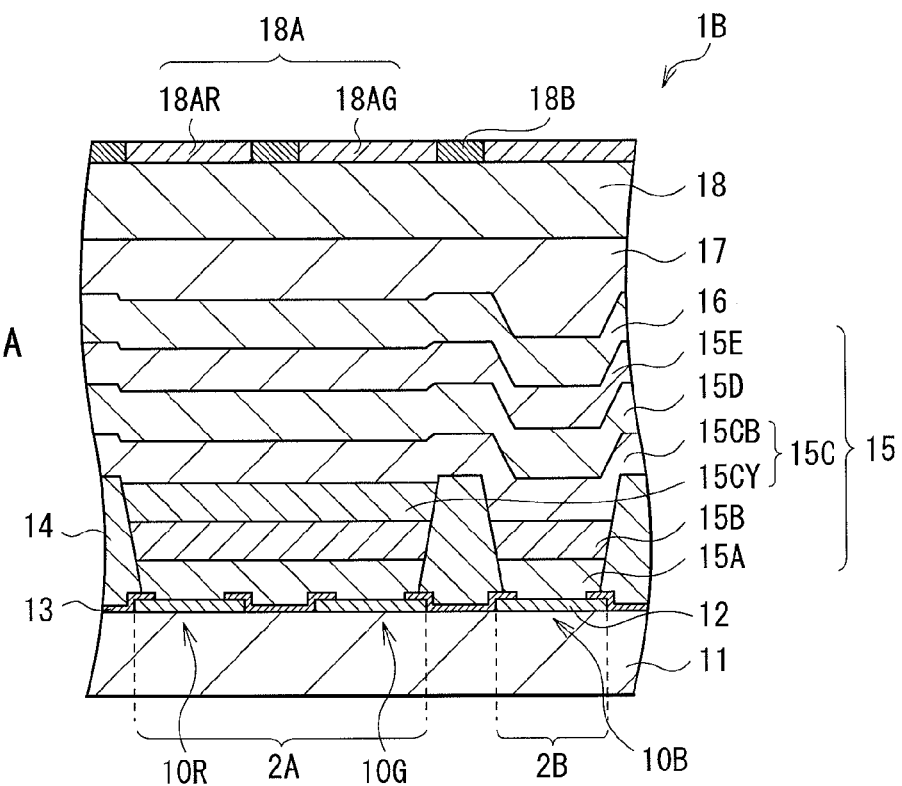
FIGS. 7A and 7B are cross-sectional views of an organic EL device forming the display illustrated in FIG. 1.
Figure 7B:
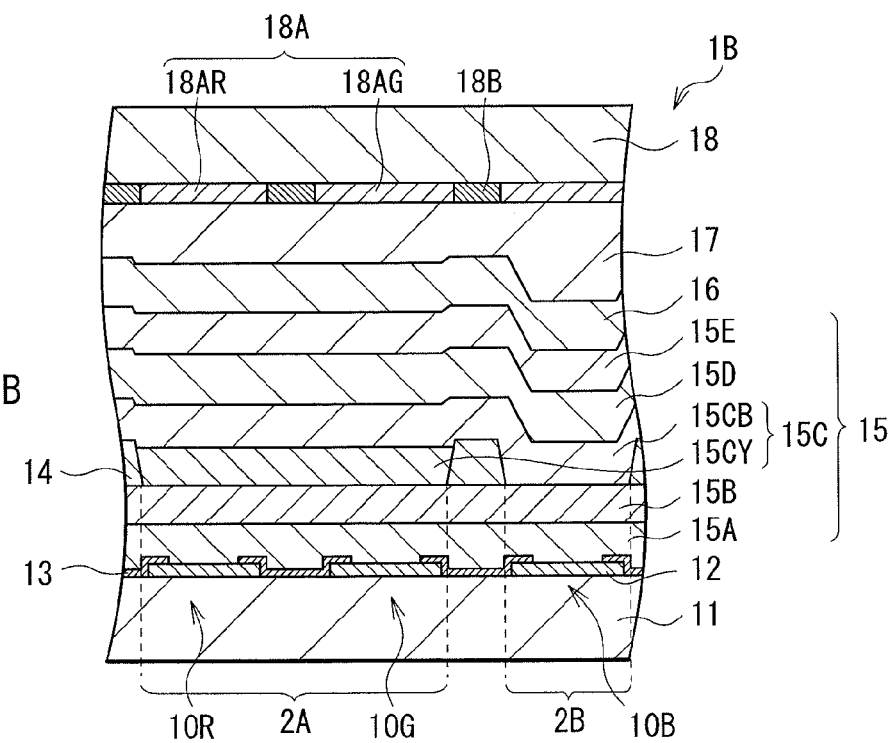

FIGS. 7A and 7B illustrate cross-sectional configurations of the organic EL devices 10 (10R, 10G, and 10B) taken along a dashed line I-I'. The organic EL device 10 is a top-emission type display device in which emission light generated at the time of recombination of a hole injected from the lower electrode 12 (first electrode: anode electrode) with an electron injected from the upper electrode 16 (second electrode: cathode electrode) in the light emitting layer 15C is extracted from the opposite side (cathode electrode side) of the substrate 11. By using the top-emission type organic EL device 10, the aperture ratio of the light emitting section of the display is improved. It is to be noted that the configuration of the organic EL device 10 according to this embodiment of the present disclosure is not limited to the foregoing configuration, and for example, the configuration of the organic EL device 10 may be a transmissive type display device in which light is extracted from the substrate 11 side, that is, may be a bottom-emission type display device.

In the organic EL device 10, for example, in the case where the display device 1A is a top-emission type display, the lower electrode 12 made of a high-reflective material such as Al, Ti, and Cr is formed on the planarizing layer 27. Further, in the case where the display device 1A is a transmissive type display, a transparent material such as ITO, IZO, and IGZO is used.

The foregoing lyophilic region 3, in this case, a lyophilic layer 13 made of, for example, $SiO_2$, $Si_3N_4$, and/or the like is formed above on the lower electrode 12 and the planarizing layer 27 except for a section where the organic layer 15 is formed. As illustrated in FIG. 7A, on the lyophilic layer 13, a liquid-repellent layer 14 is provided between an RG region 2A in which the red light emitting device 10R and the green light emitting device 10G are arranged and a B region 2B in which the blue light emitting device 10B is arranged. The liquid-repellent layer 14 is the liquid-repellent region 4 for patterning the organic layer 15. It is to be noted that the liquid-repellent layer 14 also plays the role of securing insulation properties between the lower electrode 12 and the after-mentioned upper electrode 16, and generally functions as a dividing wall. The liquid-repellent layer 14 is provided on a connection section between the gate electrode 26A and the source electrode 26B of the TFT 20 and the lower electrode 12. Alternatively, as illustrated in FIG. 7B, the liquid-repellent layer 14 may be provided on a hole transport layer 15B after a hole injection layer 15A and the hole transport layer 15B described later are sequentially layered on the lower electrode 12 and the lyophilic layer 13. As described above, the liquid-repellent layer 14 is formed of an organic material such as polyimide and novolac. By performing plasma treatment thereon, liquid repellency is added thereto.

For example, as illustrated in FIGS. 7A and 7B, the organic layer 15 has a configuration in which the hole injection layer 15A, the hole transport layer 15B, the light emitting layer 15C (a yellow light emitting layer 15CY and a blue light emitting layer 15CB), an electron transport layer 15D, and an electron injection layer 15E are layered sequentially from the lower electrode 12 side. Though details will be given later, the organic layer 15 is formed by, for example, a vacuum evaporation method, a spin coating method, or the like. The top surface of the organic layer 15 is covered with the upper electrode 16. Though each film thickness, each component material, and the like of each layer configuring the organic layer 15 are not particularly limited, an example will be given below.

The hole injection layer 15A improves efficiency of hole injection to the light emitting layer 15C, and is a buffer layer to prevent leakage. The hole injection layer 15A preferably has, for example, a thickness from 5 nm to 200 nm both inclusive, and more preferably has a thickness from 8 nm to 150 nm both inclusive. The component material of the hole injection layer 15A may be selected as appropriate according to relation with materials of an electrode and a layer adjacent thereto. Examples thereof include polyaniline, polythiophene, polypyrrole, polyphenylene vinylene, polythienylene vinylene, polyquinoline, polyquinoxaline, and a derivative thereof; a conductive polymer such as a polymer including an aromatic amine structure in a main chain or a side chain, metal phthalocyanine (copper phthalocyanine or the like), and carbon. Specific examples of the conductive polymer include oligoaniline and polydioxythiophene such as poly(3,4-ethylenedioxythiophene) (PEDOT).

The hole transport layer 15B improves efficiency to transport electron holes into the light emitting layer 15C. The hole transport layer 15B preferably has, for example, a thickness from 5 nm to 200 nm both inclusive, and more preferably has a thickness from 8 nm to 150 nm both inclusive though the thickness depends on the whole configuration of the device. As a material configuring the hole transport layer 15B, a light emitting material dissolvable into an organic solvent such as polyvinyl carbazole, polyfluorene, polyaniline, polysilane, and a derivative thereof; a polysiloxane derivative having an aromatic amine structure in a side chain or a main chain; polythiophene and a derivative thereof; polypyrrole, Alq3 may be used.

The light emitting layer 15C emits light due to electron-hole recombination by applying an electric field. In this case, the light emitting layer 15C includes a yellow light emitting layer 15CY emitting yellow light and a blue light emitting layer 15CB emitting blue light. Specifically, the yellow light emitting layer 15CY is provided in the RG region 2A, in other words, in the red light emitting device 10R and the green light emitting device 10G. The blue light emitting layer 15CB is provided as a solid film in the RG region 2A and the B region 2B, that is, in the whole surface of the pixel region. The thickness of the yellow light emitting layer 15CY is preferably, for example, from 10 nm to 20 nm both inclusive, and is more preferably from 15 nm to 100 nm both inclusive though it depends on the whole configuration of the device. The thickness of the blue light emitting layer 15CB is preferably, for example, from 2 nm to 50 nm both inclusive, and is more preferably from 5 nm to 30 nm both inclusive though it depends on the whole configuration of the device.

As a material of the light emitting layer 15C, materials emitting light of each desired color may be used. In the case where a low molecular material having a molecular weight from about 1 to about 5000 both inclusive is used as a light emitting material, as a host material and a dopant material, two or more light emitting materials are preferably mixed and used. In the case where a polymer material having a molecular weight from about 5000 to about several million both inclusive is used as a light emitting material, the light emitting material is dissolved in an organic solvent, and the resultant is used as ink.

Examples of a material of the yellow light emitting layer 15CY include a phosphorescent material or a fluorescent material each having one or more peak wavelengths in the region from 500 nm to 750 nm both inclusive. Specific examples thereof include a luminescent polymer such as a polyfluorene-based polymer derivative, a polyphenylene vinylene derivative, a polyphenylene derivative, a polyvinyl carbazole derivative, and a polythiophene derivative. Further, as a dopant material mixed in the case that the low molecular material is used as a host material, for example, a phosphorescent metal complex compound is preferably used. Specifically, as the central metal thereof, a metal selected from elements from Group 7 to Group 11 in the periodic table such as berylium (Be), boron (B), zinc (Zn), cadmium (Cd), magnesium (Mg), gold (Au), silver (Ag), palladium (Pd), platinum (Pt), aluminum (Al), gadolinium (Ga), yttrium (Y), scandium (Sc), ruthenium (Ru), rhodium (Rh), osmium (Os), and iridium (Ir) is preferably used.

As a material of the blue light emitting layer 15CB, for example, an anthracene compound as a host material is combined with a blue or green fluorescent dye as a dopant material, and thereby blue or green light is emitted. Examples of the dopant material include a material with high light emission efficiency such as a low molecular fluorescent material and an organic light emitting material such as a phosphorescent dye and a metal complex. Specific examples thereof include a compound having a peak wavelength in the region from about 400 nm to about 490 nm both inclusive. Examples thereof include an organic material such as a naphthalene derivative, an anthracene derivative, a naphthacene derivative, a styryl amine derivative, and a bis(azinyl) methene boron complex. Specially, such a compound is preferably selected from an aminonaphthalene derivative, an aminoanthracene derivative, an aminochrysene derivative, an aminopyrene derivative, a styryl amine derivative, and a bis(azinyl)methene boron complex.

It is to be noted that the light emitting layer 15C may be a light emitting layer having hole transfer characteristics that also functions as the foregoing hole transport layer 15B, for example. Further, the light emitting layer 15C may be a light emitting layer having electron transport characteristics that also functions as the after-mentioned electron transport layer 15D.

The electron transport layer 15D and the electron injection layer 15E improve efficiency to transport electrons into the light emitting layer 15C. The total film thickness of the electron transport layer 15D and the electron injection layer 15E is preferably, for example, from 5 nm to 200 nm both inclusive, and is more preferably from 10 nm to 180 nm both inclusive though the thickness depends on the whole configuration of the device.

As a material for the electron transport layer 15D, an organic material having a superior electron transport ability is preferably used. By improving transport efficiency of the light emitting layer 15C, after-mentioned change of light emission color due to electric field intensity is suppressed. Specifically, for example, an aryl pyridine derivative, a benzoimidazole derivative, and the like are preferably used, since thereby high electron supply efficiency is retained even at a low drive voltage. Examples of the material of the electron injection layer 15E include an alkali metal, an alkali earth metal, a rare-earth metal and an oxide, a composite oxide, a fluoride, and a carbonate thereof.

The upper electrode 16 has a thickness of, for example, about 10 nm, and is made of a material having favorable optical transparency and a small work function. Further, by forming a transparent conductive film by using an oxide, light extraction is secured. In this case, ZnO, ITO, IZnO, InSnZnO, and/or the like may be used. Further, though the upper electrode 16 may be formed of a single layer, in this case, the upper electrode 16 has a structure in which a first layer 16A, a second layer 16B, and a third layer 16C are sequentially layered from the lower electrode 12 side, for example.

The first layer 16A is preferably made of a material having a small work function and favorable optical transparency. Specific examples thereof include an alkali earth metal such as calcium (Ca) and barium (Ba), an alkali metal such as lithium (Li) and cesium (Cs), indium (In), magnesium (Mg), and silver (Ag). Further examples thereof include an alkali metal oxide, an alkali metal fluoride, an alkali earth metal oxide, and an alkali earth metal fluoride such as $Li_2O$, $Cs_2CO_3$, $Cs_2SO_4$, MgF, LiF, and $CaF_2$.

The second layer 16B is made of a material having optical transparency and favorable electric conductivity such as a thin film MgAg electrode and a thin film Ca electrode. For the third layer 16C, a transparent lanthanoid-based oxide is preferably used in order to suppress degradation of the electrode. Thereby, the second layer 16B is allowed to be used as a sealing electrode with which light is allowed to be transmitted from the top surface. Further, in the case of a bottom-emission type display, as a material of the third layer 16C, gold (Au), platinum (Pt), AuGe, or the like is used.

It is to be noted that the first layer 16A, the second layer 16B, and the third layer 16C are formed by a method such as a vacuum evaporation method, a sputtering method, and a plasma CVD method. Further, in the case where the drive method of a display configured by using the display device is active matrix type, the upper electrode 16 may be formed as a solid film over the substrate 11 in a state of being insulated from the lower electrode 12 by the liquid-repellent layer 14 (dividing wall) that cover part of the lower electrode 12, and the organic layer 15, and may be used as an electrode common to the respective pixels.

Further, the upper electrode 16 may be a mixed layer containing an organic light emitting material such as an aluminum quinoline complex, a styrylamine derivative, and a phthalocyanine derivative. In this case, the upper electrode 16 may further separately have a layer having optical transparency such as MgAg as the third layer 16C (not illustrated). Further, the laminated structure of the upper electrode 16 is not limited to the foregoing laminated structure. It is needless to say that the upper electrode 16 may have an optimal combination and an optimal laminated structure according to the structure of the device to be fabricated. For example, the configuration of the upper electrode 16 according to this embodiment described above is a laminated structure in which each function of each layer of the electrode separately exists, that is, a laminated structure in which the inorganic layer (first layer) promoting electron injection into the organic layer 15, the inorganic layer (second layer) being the electrode, and the inorganic layer (third layer) protecting the electrode separately exist. However, the inorganic layer promoting electron injection into the organic layer 15 may function as the inorganic layer being the electrode as well, and these layers may be formed as a single-layer structure.

Further, in the case where the organic EL device 10 has a cavity structure, the upper electrode 16 is preferably formed by using a translucent and semi-reflective material. Thereby, emission light that has been subjected to multiple interference between the light reflecting surface on the lower electrode 12 side and the light reflecting surface on the upper electrode 16 side is extracted from the upper electrode 16 side. In this case, the optical distance between the light reflecting surface on the lower electrode 12 side and the light reflecting surface on the upper electrode 16 side is determined by wavelength of light desired to be extracted, and each film thickness of each layer is set to satisfy the optical distance. In such a top-emission type display device, by positively using the cavity structure, efficiency of extracting light outside is improved, and light emission spectrum is allowed to be controlled.

A protective layer 17 prevents moisture intrusion into the organic layer 15, and is made of a material with low transparency and low water permeability being, for example, from 2 μm to 3 μm both inclusive thick. The protective layer 17 may be made of any of an insulating material and a conductive material. Preferable examples of the insulating material include an inorganic amorphous insulating material such as amorphous silicon ($\alpha$-Si), amorphous silicon carbide ($\alpha$-SiC), amorphous silicon nitride ($\alpha$-$Si_{1-x}N_x$), and amorphous carbon ($\alpha$-C). Such an inorganic amorphous insulating material does not structure grains. Therefore, a favorable protective film with low water permeability is obtained.

A sealing substrate 18 is located on the upper electrode 16 side of the organic EL device 10, and seals the organic EL device 10 together with an adhesive layer (not illustrated). The sealing substrate 18 is made of a material such as glass transparent to light generated in the organic EL device 10. The sealing substrate 18 is, for example, provided with a color filter 18A and a light shielding film 18B as a black matrix. Thereby, in the sealing substrate 18, light generated in the organic EL device 10 is extracted, outside light reflected in wiring between each of the organic EL devices 10 is absorbed, and the contrast is improved.

The color filter 18A has a red filter 18AR and a green filter 18AG respectively over the red light emitting device 10R and the green light emitting device 10G. The red filter 18AR and the green filter 18AG are respectively arranged in the shape of, for example, a rectangle. The red filter 18AR and the green filter 18AG are respectively made of a resin mixed with a pigment. By selecting a pigment, adjustment is made so that optical transparency in the intended red or green wavelength region is high, and optical transparency in the other wavelength regions is low. Though a color filter is not provided over the blue light emitting device 10B in this case, a blue color filter may be provided.

The light shielding film 18B is formed of, for example, a black resin film having an optical density of 1 or more in which a black colorant is mixed or a thin film filter using thin film interference. Of the foregoing, the light shielding film 18B is preferably formed of the black resin film, since thereby the film is formed inexpensively and easily. The thin film filter is obtained by laminating one or more thin films made of a metal, a metal nitride, or a metal oxide, and attenuates light by using thin film interference. Specific examples of the thin film filter include a filter in which Cr and chromium oxide (III) ($Cr_2O_3$) are alternately laminated.

The organic EL display 1 may be manufactured, for example, as follows.

Figure 8:
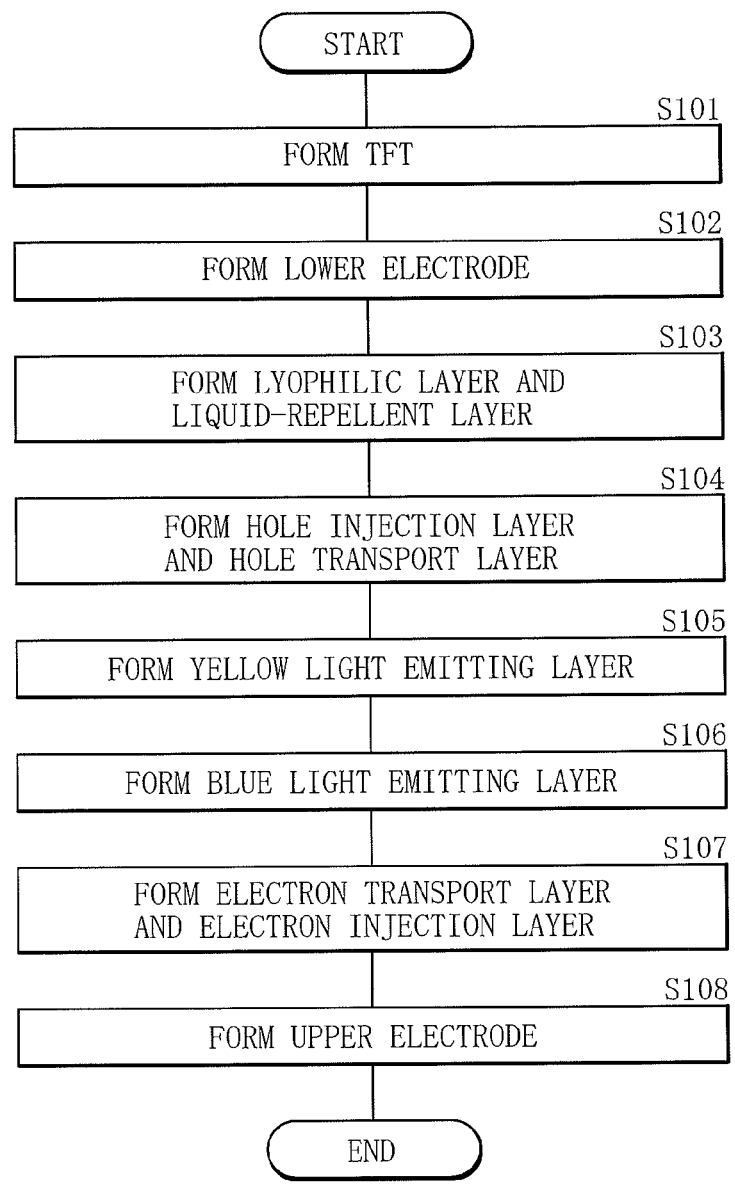
FIG. 8 illustrates a flow of manufacturing steps of the display illustrated in FIG. 1.

FIG. 8 illustrates a flow of a method of manufacturing the organic EL display 1. First, the pixel drive circuit 140 including the transistor 20 is formed on the substrate 11 made of the foregoing material, and the planarizing layer 27 made of, for example, a photosensitive resin is provided (step S101).

[Step of Forming Lower Electrode 12]

Next, a transparent conductive film made of, for example, ITO is formed on the whole surface of the substrate 11. The transparent conductive film is patterned and thereby the lower electrode 12 is formed respectively for the red organic EL device 10R, the green organic EL device 10G, and the blue organic EL device 10B (step S102). At this time, the lower electrode 12 is conducted to the drain electrode 26B of the transistor 20 through a contact hole of the planarizing layer 27.

[Step of Forming Lyophilic Layer 13 and Liquid-Repellent Layer 14]

Subsequently, the lyophilic layer 13 defining a pixel shape is formed by forming a film on the lower electrode 12 and the planarizing layer 27 by, for example, a slit coating method and subsequently performing patterning by using a photolithography method. Next, a film made of an inorganic insulating material such as $SiO_2$ is formed by a CVD (chemical vapor deposition) method to form the dividing wall that separates the RG region 2A from the B region 2B. After that, water repellency of the surface of the dividing wall is improved by plasma treatment, and thereby the liquid-repellent layer 14 is formed (step S103).

[Step of Forming Hole Injection Layer 15A and Hole Transport Layer 15B]

After the plasma treatment is performed, the hole injection layer 15A and the hole transport layer 15B each made of the foregoing material are sequentially formed in the region surrounded by the liquid-repellent layer 14 (step S104). The hole injection layer 15A and the hole transport layer 15B are formed by a spin coating method, a spray coating method, or slit printing.

[Step of Forming Yellow Light Emitting Layer 15CY]

After the hole transport layer 15B is formed, the yellow light emitting layer 15CY is formed (step S105). The yellow light emitting layer 15CY is formed by using, for example, an ink jet method, a nozzle coating method, or a stripe coating method.

[Step of Forming Blue Light Emitting Layer 15CB, Electron Transport Layer 15D, Electron Injection Layer 15E, and Upper Electrode 16]

After the yellow light emitting layer 15CY is formed, the blue light emitting layer 15CB is formed on the whole surfaces of the hole transport layer 15B and the yellow light emitting layer 15CY by an evaporation method (step S106). Subsequently, the electron transport layer 15D, the electron injection layer 15E, and the upper electrode 16 are formed on the whole surface of the blue light emitting layer 15CB by an evaporation method (steps S107 and S108).

After the upper electrode 16 is formed, the protective layer 17 and the sealing substrate 18 including the color filter 18A and the light shielding film 18B are formed. Specifically, first, the protective layer 17 is formed by a film formation method such as an evaporation method and a CVD method with small energy of film formation particles to the degree at which no effect is made on the base. For example, in the case where the protective layer 17 made of amorphous silicon nitride is formed, the protective layer 17 having a film thickness of from 2 to 3 μm both inclusive is formed by a CVD method. At this time, in order to prevent lowering of luminance due to degradation of the organic layer 15, film formation temperature is desirably set to ambient temperature. In addition, in order to prevent exfoliation of the protective layer 17, the film is desirably formed under conditions in which the film stress becomes the minimum.

The blue light emitting layer 15CB, the electron transport layer 15D, the electron injection layer 15E, the upper electrode 16, and the protective layer 17 are fully formed in a state of a solid film without using a mask. Further, forming of the blue light emitting layer 15CB, the electron transport layer 15D, the electron injection layer 15E, the upper electrode 16, and the protective layer 17 are desirably formed continuously in the same film forming device without being exposed to the air. Thereby, degradation of the organic layer 15 due to moisture in the air is prevented.

It is to be noted that, in the case where an auxiliary electrode (not illustrated) is formed in the same step as that of the lower electrode 12, the organic layer 15 formed in a state of a solid film on the auxiliary electrode may be removed by a method such as laser ablation before forming the upper electrode 16. Thereby, the upper electrode 16 is allowed to be directly connected to the auxiliary electrode, and contact characteristics are improved.

After the protective layer 17 is formed, for example, the light shielding film 18B made of the foregoing material is formed on the sealing substrate 18 made of the foregoing material. Subsequently, the sealing substrate 18 is coated with a material of the red filter 18AR by a spin coating method or the like. The resultant is patterned by photolithography technology, burned, and thereby the red filter 18AR is formed. Subsequently, the green filter 18AG is formed in the similar manner to that of the red filter 18AR.

After that, the adhesive layer (not illustrated) is formed on the protective layer 17, and the sealing substrate 18 is bonded with the protective layer 17 with the adhesive layer in between. Accordingly, the organic EL displays 1A and 1B illustrated in FIG. 1, FIG. 2, FIG. 6, and FIG. 7A are completed.

It is to be noted that, as illustrated in FIG. 7B, alternatively, the liquid-repellent layer 14 may be formed on the hole transport layer 15B as follows. First, the hole injection layer 15A and the hole transport layer 15B are formed as described above. After that, the liquid-repellent layer 14 is formed by using, for example, an ink jet method, a nozzle coating method, a stripe coating method, relief printing, flexo printing, offset printing, or gravure printing. Next, the yellow light emitting layer 15CY and the layers to be formed thereon are formed by using the foregoing methods. Thereby, the hole injection layer 15A and the hole transport layer 15B are easily formed.

In the organic EL displays 1A and 1B, a scanning signal is supplied from the scanning line drive circuit 130 to each pixel through a gate electrode of the writing transistor Tr2, and an image signal from the signal line drive circuit 120 is retained in the retentive capacity Cs through the writing transistor Tr2. That is, ON and OFF of the drive transistor Tr1 is controlled according to the signal retained in the retentive capacity Cs, and thereby drive current Id is injected into the red organic EL device 10R, the green organic EL device 10G, and the blue organic EL device 10B, electron-hole recombination is generated, and thereby light is emitted. The light is transmitted thorough the lower electrode 12 and the substrate 11 in the case of bottom emission, or is transmitted through the upper electrode 16 and the color filter 18A provided in the sealing substrate 18 in the case of top emission, and is extracted.

In the displays 1A and 1B according to this embodiment, the dividing wall is provided only between the RG region 2A including the red pixel 5R and the green pixel 5G and the B region 2B including the blue pixel 5B, and the dividing wall is not provided between the red pixel and the green pixel having the common light emitting layer. Thereby, the thickening of the organic layer 15 (in particular, the light emitting layer 15C) in the pixels due to wetting is decreased, and the aperture ratio of the pixels is improved. A description thereof will be hereinafter further given.

Figure 9:
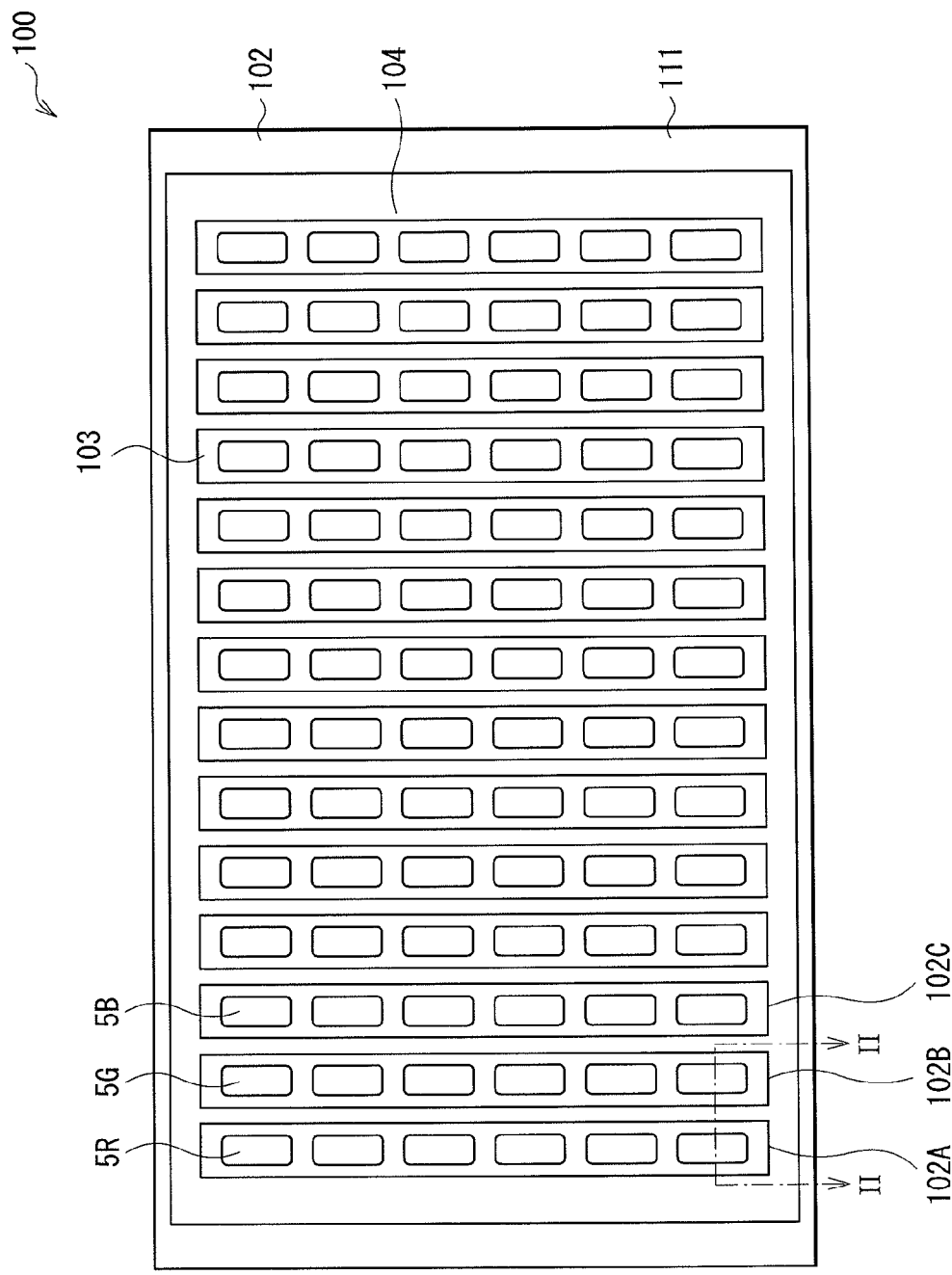
FIG. 9 is a plan view illustrating a configuration of a display according to a comparative example.
Figure 10A:
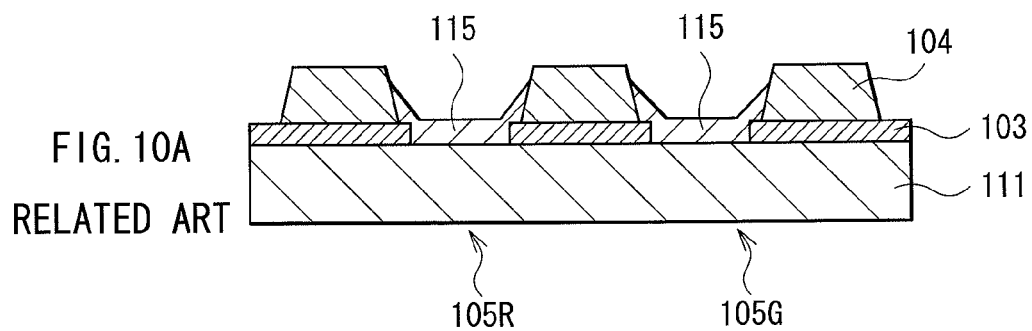
FIGS. 10A and 10B are schematic views illustrating cross-sectional views of the displays according to the comparative example and the embodiment of the present disclosure.
Figure 10B:
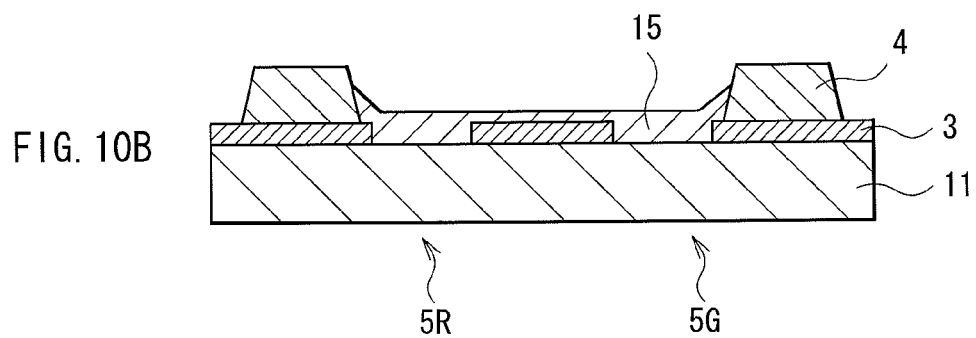

As described above, the viscosity of the ink in which the organic material forming the organic layer 15 is dissolved is low, the contact angle thereof is low, and therefore the wettability thereof is high. Therefore, the discharged ink is spread on the display region 2 or the peripheral region 6, resulting in significantly lowered reliability of the substrate. Further, in this case, patterning is difficult, and each film thickness of the respective pixels 5R, 5G, and 5B is difficult to control. One of the methods to resolve such a disadvantage is a method in which, for example, as illustrated in FIG. 9, the red pixels 5R, the green pixels 5G, and the blue pixels 5G are arranged linearly by separating these pixels by color, liquid-repellent regions are provided between pixel lines, and thereby the pixels are separated by color. However, regarding ink with which pixel regions of each color (an R region 102A, a G region 102B, and a B region 102C) is coated, its solvent is gradually evaporated from the outer edge section at the time of drying, and the organic material is solidified onto the side surfaces of the dividing wall. Accordingly, ink remaining in the pixel region creeps up along the organic material solidified on the side surfaces of the dividing wall. FIG. 10A schematically illustrates a cross-sectional configuration taken along a dashed line II-II of FIG. 9. The film thickness of an organic layer 115 on the periphery of the pixel along the extending direction of a liquid-repellent region (dividing wall) 104 is increased. Since the efficiency of light emission in the region where the film thickness is increased is lowered, the aperture ratio of respective pixels 105R, 105G, and 105B is lowered.

Meanwhile, in the displays 1A and 1B according to this embodiment, the dividing wall is not provided between the red pixel 5R and the green pixel 5G, and the organic layer 15 including the common light emitting layer 15C (in this case, 15CY) is provided. Thereby, wetting between the red pixel 5R and the green pixel 5G is prevented from occurring.

Table 1 summarizes effective pixel regions, the maximum aperture ratios, the minimum coating widths, and the numbers of coating of the displays 1A and 1B according to this embodiment and a display 100 as a comparative example. The table shows that in the displays 1A and 1B in which the dividing wall is not provided between the red pixel 5R and the green pixel 5G, and the organic layer 15 including the common light emitting layer 15C is provided, the effective pixel regions and the maximum aperture ratios are more improved than those in the display 100 in which the dividing wall is provided between the red pixel 5R and the green pixel 5G, and separate coating of R and G is performed. In particular, in the display 1A in which the red pixel 5R and the green pixel 5G are arranged so that the longitudinal directions thereof are adjacent to each other, the effective pixel region and the maximum aperture ratio are more improved. Further, since the RG region 3A and the B region 3B extending in the longitudinal direction of the display region 2 are formed in this case, the number of coating is small, that is, the coating step is simplified.

TABLE 1

|  | Effective pixel region ($\mu m^2$) | Maximum aperture ratio (%) | Minimum coating width ($\mu m$) | The number of coating (batch coating of 60 lines) |
|---|---|---|---|---|
| Display 1A | 17980 | 76 | 165 | 18 scannings |
| Display 1B | 15008 | 73 | 165 | 32 scannings |
| Display 100 (comparative example) | 12328 | 65 | 165 | 64 scannings |

As described above, in the displays 1A and 1B according to this embodiment, the dividing wall is not provided between the red pixel 5R and the green pixel 5G, and the organic layer 15 including the common light emitting layer 15C (in this case, 15CY) is provided. Therefore, wetting between the red pixel 5R and the green pixel 5G is prevented from occurring. Specifically, since half or more of wetting on the periphery of the red pixel 5R and the green pixel 5G is decreased, and thereby, the effective pixel region is widened and the aperture ratio is largely improved. Further, the pattern precision of the pixel 5 is largely modified while high resolution is retained. Therefore, compared to the existing displays such as the display 100, resolution double or higher is obtained. That is, a high-resolution display and an electronic unit are provided.

Further, compared to the displays in which a white pixel is formed in the whole display region, and red light, green light, and blue light are extracted from the color filters such as the display according to Japanese Unexamined Patent Application Publication No. 2006-269253 as described above, a display with a smaller electric power consumption, that is, a highly reliable full-color display is provided.

Further, in the foregoing display 100, different light emitting layers (a red light emitting layer, a green light emitting layer, and a blue light emitting layer) are provided respectively for the red pixel 105R, the green pixel 105G, and the blue pixel 105B. However, in this embodiment, the light emitting layer 15C (in this case, the yellow light emitting layer 15CY) is common to the red organic EL device 10R and the green organic EL device 10G provided for the red pixel 5R and the green pixel 5G, and red light and green light are obtained by color separation with the use of the color filter 18A (the red color filter 18AR and the green color filter 18AG). Thereby, its cost is reduced, and the manufacturing steps are allowed to be simplified.

[Modification]

Figure 11:
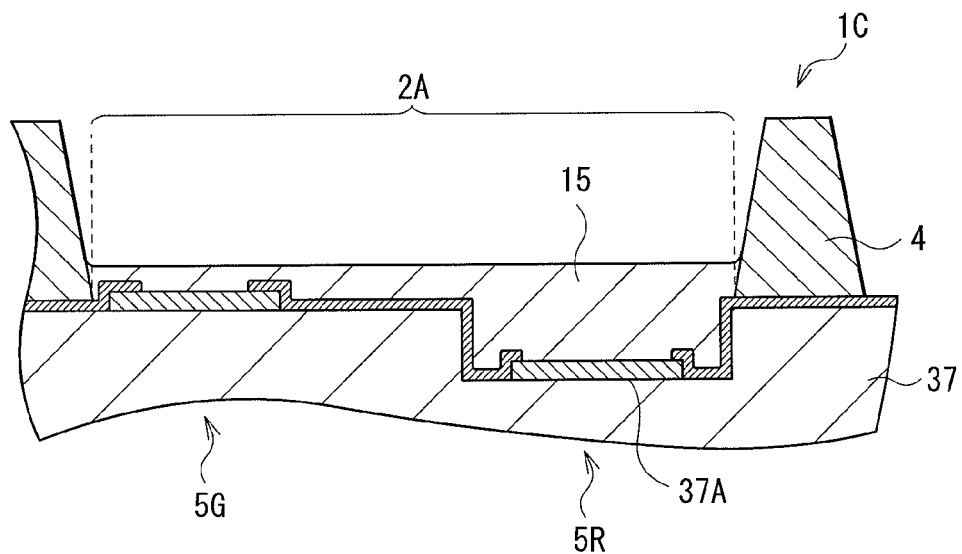
FIG. 11 is a schematic view illustrating part of a cross section of a display according to a modification of the embodiment of the present disclosure.

FIG. 11 illustrates part of a cross-sectional configuration of the red pixel 5R and the green pixel 5G in a display 1C according to a modification of the embodiment of the present disclosure. The display 1C according to this modification 1 is different from the first embodiment in a point that the film thickness of the organic layer 15 on the red pixel 5R provided in the RG region 2A is different from that of the organic layer 15 on the green pixel 5G provided in the same RG region 2A.

In the display 1C according to this modification, a step according to light emission color separated by the color filter 18A is provided in a planarizing film 37 provided on the TFT 20, and thereby the film thickness of the organic layer 15 (for example, the hole injection layer 15A, the hole transport layer 15B, and the yellow light emitting layer 15CY) of the organic EL devices 10R and 10G is adjusted. Specifically, in the planarizing film 37, a concave section 37A is formed in a location corresponding to a pixel on the longer wavelength side (in this case, the red pixel 5R) than the shorter wavelength (in this case, the green pixel 5G) by etching and/or the like. Thereby, by coating with ink in which an organic material of the organic layer 15 is dissolved, the hole injection layer 15A, the hole transport layer 15B, and the like each having a film thickness according to the film thickness ratio of the planarizing film 37 are formed, the injection efficiency of holes according to each color is adjusted, and each light emission efficiency of each color is improved.

Table 2 summarizes change of extraction efficiency of red light emission according to the depth of the concave section when the concave section 37A is provided in the planarizing film 37 provided with the red pixel 5R. Each light emission efficiency in the case where the concave sections 37A having respective depths of 0.2 μm, 0.5 μm, 1 μm, and 1.5 μm are provided in a location corresponding to the red pixel 5R in the planarizing film 37 is improved by from 10% to 40% both inclusive based on the extraction efficiency in the case that no concave section is provided as the reference.

TABLE 2

| Depth of concave section (μm) | Extraction efficiency | |
|---|---|---|
| | Green (G) | Red (R) |
| 0 | 1 | 1 |
| 0.2 | 1 | 1.1 |
| 0.5 | 1 | 1.3 |
| 1 | 1 | 1.4 |
| 1.5 | 1 | 1.1 |

Accordingly, in the display 1C in this modification, by providing the concave section 37A in the planarizing film 37 to adjust the film thickness of the organic layer 15, emission light having desired chromaticity is extracted effectively.

The foregoing displays 1A, 1B, and 1C are allowed to be mounted on electronic units described in the after-mentioned application examples 1 to 5, for example.

Module and Application Examples

A description will be given of application examples of the displays 1A, 1B, and 1C described in the foregoing embodiment and the modification. The displays 1A, 1B, and 1C according to the foregoing embodiment and the like are allowed to be applied to a display of an electronic unit in any field for displaying an image signal inputted from outside or an image signal generated inside as an image or a video picture such as a television, a digital camera, a notebook personal computer, a portable terminal device such as a mobile phone, and a video camcorder.

[Module]

Figure 12:
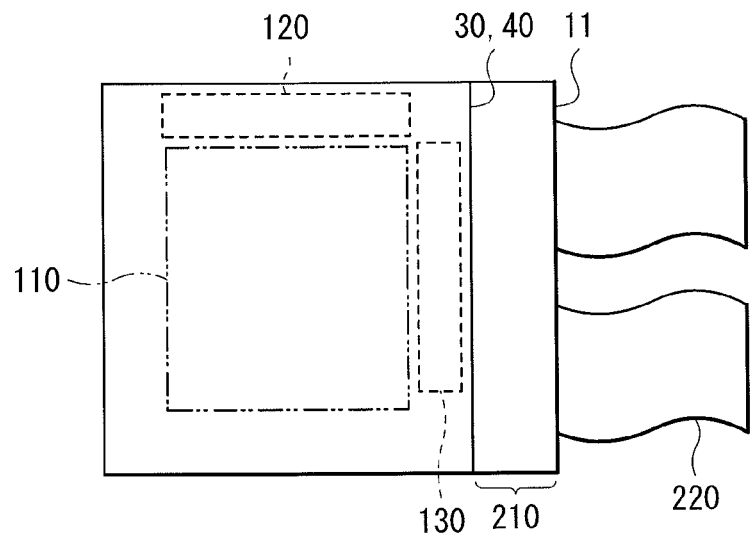

The displays 1A, 1B, and 1C according to the foregoing embodiment and the like are incorporated in various electronic units such as the after-mentioned application examples 1 to 5 as a module as illustrated in FIG. 12, for example. In the module, for example, a region 210 exposed from a protective layer 40 and a sealing substrate 30 is provided on a side of the substrate 11, and an external connection terminal (not illustrated) is formed in the exposed region 210 by extending the wirings of the signal line drive circuit 120 and the scanning line drive circuit 130. The external connection terminal may be provided with a flexible printed circuit (FPC) 220 for inputting and outputting a signal.

Application Example 1

Figure 13:
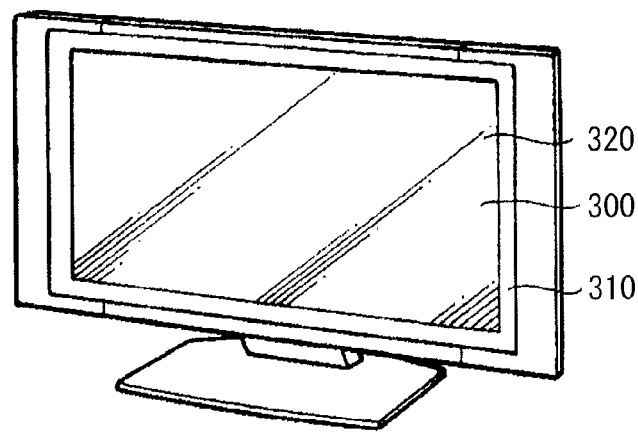
FIG. 13 is a perspective view illustrating an appearance of an application example 1.

FIG. 13 illustrates an appearance of a television to which the displays 1A, 1B, and 1C according to the foregoing embodiment and the like are applied. The television has, for example, an image display screen section 300 including a front panel 310 and a filter glass 320. The image display screen section 300 is configured of one of the displays 1A, 1B, and 1C according to the foregoing embodiment and the like.

Application Example 2

Figure 14A:
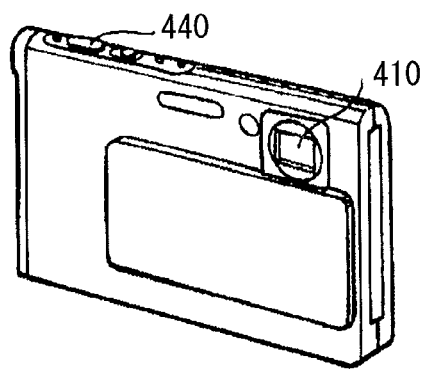
FIG. 14A is a perspective view illustrating an appearance viewed from the front side of an application example 2.
Figure 14B:
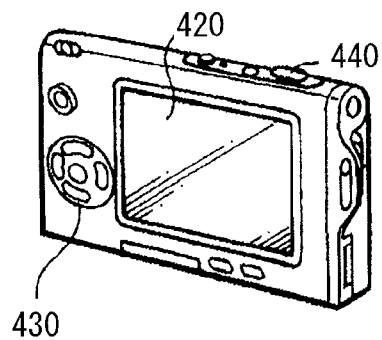
FIG. 14B is a perspective view illustrating an appearance viewed from the rear side of the application example 2.

FIGS. 14A and 14B illustrate appearances of a digital camera to which the displays 1A, 1B, and 1C according to the foregoing embodiment and the like are applied. The digital camera has, for example, a light emitting section 410 for a flash, a display section 420, a menu switch 430, and a shutter button 440. The display section 420 is configured of one of the displays 1A, 1B, and 1C according to the foregoing embodiment and the like.

Application Example 3

Figure 15:
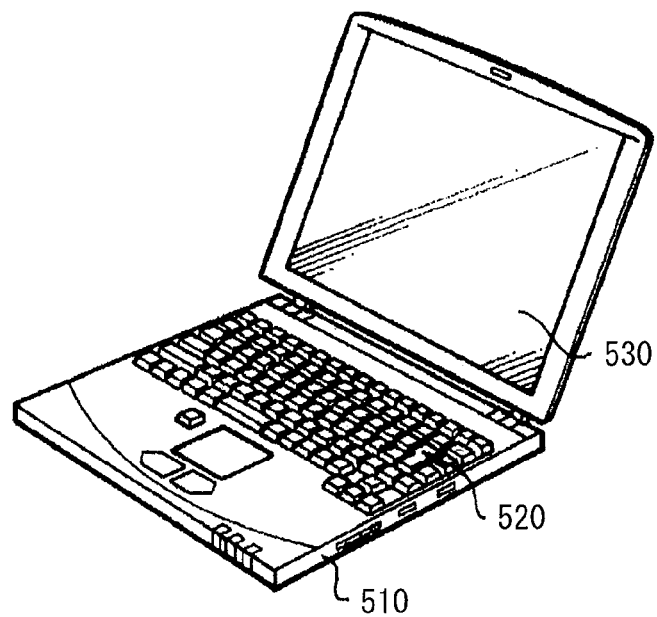
FIG. 15 is a perspective view illustrating an appearance of an application example 3.

FIG. 15 illustrates an appearance of a notebook personal computer to which the displays 1A, 1B, and 1C according to the foregoing embodiment and the like are applied. The notebook personal computer has, for example, a main body 510, a keyboard 520 for operation of inputting characters and the like, and a display section 530 for displaying an image. The display section 530 is configured of one of the displays 1A, 1B, and 1C according to the foregoing embodiment and the like.

Application Example 4

Figure 16:
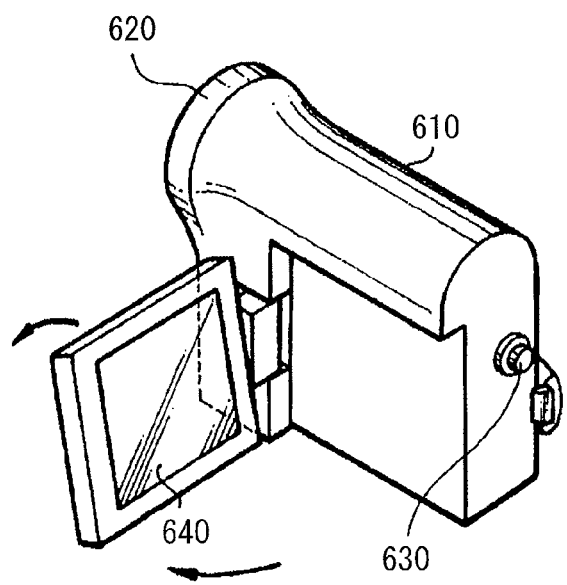
FIG. 16 is a perspective view illustrating an appearance of an application example 4.

FIG. 16 illustrates an appearance of a video camcorder to which the displays 1A, 1B, and 1C according to the foregoing embodiment and the like are applied. The video camcorder has, for example, a main body 610, a lens 620 for shooting an object provided on the front side surface of the main body 610, a start-and-stop switch 630 in shooting, and a display section 640. The display section 640 is configured of one of the displays 1A, 1B, and 1C according to the foregoing embodiment and the like.

Application Example 5

FIGS. 17A to 17G illustrate appearances of a mobile phone to which the displays 1A, 1B, and 1C according to the foregoing embodiment and the like are applied. In the mobile phone, for example, an upper package 710 and a lower package 720 are jointed by a joint section (hinge section) 730. The mobile phone has a display 740, a sub-display 750, a picture light 760, and a camera 770. The display 740 or the sub-display 750 is configured of one of the displays 1A, 1B, and 1C according to the foregoing embodiment and the like.

While the present disclosure has been described with reference to the embodiment and the modification, the present disclosure is not limited to the foregoing embodiment and the like, and various modifications may be made. For example, in the foregoing embodiment and the like, the yellow light emitting material is used as a material of the yellow light emitting layer 15CY. However, the material of the yellow light emitting layer 15CY is not limited thereto, and a mixture of a red light emitting material and a green light emitting material may be used. Further, in the foregoing embodiment and the like, one display pixel includes the red pixel 5R, the green pixel 5G, and the blue pixel 5B. However, the configuration thereof is not limited thereto, and one display pixel may include the red pixel 5R, the green pixel 5G, the blue pixel 5B, and a yellow pixel. In this case, the yellow pixel may be formed in the RG region 2A.

Further, the materials, the thicknesses, the film-forming methods, the film-forming conditions, and the like of each layer are not limited to those described in the foregoing embodiment and the like, and other material, other thickness, other film-forming method, and other film-forming conditions may be adopted. For example, in the foregoing first embodiment, the oxide semiconductor is used as a channel in the TFT 20. However, the material is not limited thereto, and silicon, organic semiconductor, or the like may be used.

Further, in the foregoing embodiment and the like, the description has been specifically given of the configurations of the organic EL devices 10R, 10G, and 10B, and the like. However, it is not always necessary to provide all layers, and other layer may be further provided. For example, the light emitting layer 15C (the yellow light emitting layer 15CY and the blue light emitting layer 15CB) may be formed directly on the hole injection layer 15A without forming the electron transport layer 15B on the hole injection layer 15A.

Furthermore, the organic layer 15 may be formed by a coating method such as a spin coating method, a dipping method, a doctor blade method, a discharge coating method, and a spray coating method; a printing method such as an ink jet method, an offset printing method, a relief printing method, an intaglio printing method, a screen printing method, and a micro gravure printing method; or the like in addition to the foregoing method. According to characteristics of each organic layer and each member, a dry process and a wet process may be used in combination.

Further, in the foregoing embodiment and the like, the description has been given of the active matrix display. However, the present disclosure is applicable to a passive matrix display as well. Furthermore, the configuration of the pixel drive circuit for driving the active matrix is not limited to the configuration described in the foregoing embodiment. As needed, a capacity device and/or a transistor may be added. In this case, according to the change of the pixel drive circuit, a necessary drive circuit may be added in addition to the foregoing signal line drive circuit 120 and the foregoing scanning line drive circuit 130.

It is possible to achieve at least the following configurations from the above-described exemplary embodiment and the modification of the disclosure.

(1) A display including:
a first region including first pixels configured of a single color;
a second region including second pixels configured of a plurality of colors different from the single color, the second pixels having an organic layer including a common light emitting layer; and
a dividing wall separating the first region from the second region.
(2) The display according to (1), wherein the second pixels are color-separated by a color filter.
(3) The display according to (1) or (2), wherein the dividing wall is subjected to water-repellent treatment.
(4) The display according to any one of (1) to (3), wherein
lyophilic regions are provided around the first pixels and the second pixels, and
shapes of the first and second pixels are determined by the lyophilic regions.
(5) The display according to any one of (1) to (4), wherein the second pixels are arranged in a line in a state that the adjacent second pixels have the colors different from each other.
(6) The display according to (5), wherein
the second pixels each have a rectangular shape, and
a longitudinal direction of the second pixels is arranged perpendicular to an extending direction of the dividing wall.
(7) The display according to any one of (1) to (6), wherein the second pixels are linearly arranged being separated by color along an extending direction of the dividing wall.
(8) The display according to any one of (1) to (7), wherein
the first and second pixels each include a thin film transistor provided on a substrate and a display device having a light emitting layer provided on the thin film transistor, and
the thicknesses of the light emitting layer in the second pixels are different depending on the color due to provision of a step in a planarizing film between the thin film transistor and the display device.

(9) The display according to (8), wherein
the display device includes
a lower electrode provided on the planarizing film,
a hole injection-transport layer provided on the lower electrode, the hole injection-transport layer having hole injection characteristics or hole transport characteristics or both,
a light emitting layer provided on the hole injection-transport layer,
an electron injection-transport layer provided on the light emitting layer, the electron injection-transport layer being provided continuously on whole surfaces of the first and second regions, the electron injection-transport layer having electron injection characteristics or electron transport characteristics or both, and
an upper electrode.

(10) The display according to (9), wherein
the light emitting layer of the display device provided in the first region is provided continuously on the whole surfaces of the first and second regions, and
the light emitting layer of the display device provided in the first region is laminated on the light emitting layer of the display device provided in the second region.

(11) The display according to (10), wherein the light emitting layer of the display device provided in the first region is formed by an evaporation method.

(12) The display according to any one of (9) to (11), wherein the hole injection-transport layer and the light emitting layer of the display device provided in the second region are formed by one of a printing method using a discharge method, a printing method using a plate, and a spraying method.

(13) The display according to any one of (9) to (11), wherein the hole injection-transport layer is formed on the whole surfaces of the first and second regions by one of a slit coating method, a spray coating method, and a spin coating method.

(14) An electronic device including a display, the display including:
a first region including first pixels configured of a single color;
a second region including second pixels configured of a plurality of colors different from the single color, the second pixels having an organic layer including a common light emitting layer; and
a dividing wall separating the first region from the second region.

The present disclosure contains subject matter related to that disclosed in Japanese Priority Patent Application JP 2011-196738 filed in the Japanese Patent Office on Sep. 9, 2011, the entire contents of which is hereby incorporated by reference.

It should be understood by those skilled in the art that various modifications, combinations, sub-combinations, and alternations may occur depending on design requirements and other factors insofar as they are within the scope of the appended claims or the equivalents thereof.

What is claimed is:
1. A display comprising:
a first region including first pixels configured of a single color;
a second region including second pixels configured of a plurality of colors different from the single color;
a first dividing wall separating the first region from the second region;
a second dividing wall separating the second region from another first region, wherein a dividing wall is not provided between the plurality of colors in the second region;
a lyophilic region between the plurality of colors in the second region;
a hole injection-transport layer disposed on central portions of the upper surface of the lyophilic region between lower electrodes associated with the plurality of colors in the second region, wherein the hole injection-transport layer includes a hole injection layer and a hole transport layer;
a light emitting layer including first and second layers, wherein the first layer of the light emitting layer is a common light emitting layer continuously disposed on surfaces of the hole injection-transport layer in the second region between the first dividing wall and the second dividing wall, wherein the second layer of the light emitting layer is disposed on the common light emitting layer in the second region, and wherein the second layer of the light emitting layer is disposed on the hole injection-transport layer in the first region.

2. The display according to claim 1, wherein the second pixels are color-separated by a color filter.

3. The display according to claim 1, wherein the dividing wall is subjected to water-repellent treatment.

4. The display according to claim 1, wherein lyophilic regions are provided around the first pixels and the second pixels, and
shapes of the first and second pixels are determined by the lyophilic regions.

5. The display according to claim 1, wherein the second pixels are arranged in a line such that adjacent second pixels have colors different from each other.

6. The display according to claim 5, wherein the second pixels each have a rectangular shape, and
a longitudinal direction of the second pixels is arranged perpendicular to an extending direction of the dividing wall.

7. The display according to claim 1, wherein the second pixels are linearly arranged being separated by color along an extending direction of the dividing wall.

8. The display according to claim 1, wherein the first and second pixels each include a thin film transistor provided on a substrate and a display device having the light emitting layer provided on the thin film transistor, and
the thicknesses of the light emitting layer in the second pixels are different for each of the plurality of colors due to a step in a planarizing film between the thin film transistor and the display device.

9. The display according to claim 8, wherein the display device further includes:
an electron injection-transport layer provided on the light emitting layer, the electron injection-transport layer being provided continuously on surfaces of the first and second regions, the electron injection-transport layer having electron injection characteristics or electron transport characteristics or both and the hole injection-transport layer having hole injection characteristics or hole transport characteristics or both; and
an upper electrode.

10. The display according to claim 9, wherein the light emitting layer of the display device provided in the first region is formed by an evaporation method.

11. The display according to claim 9, wherein the hole injection-transport layer and the light emitting layer of the display device provided in the second region are formed by one of a printing method using a discharge method, a printing method using a plate, and a spraying method.

12. The display according to claim 9, wherein the hole injection-transport layer is formed on the surfaces of the first and second regions by one of a slit coating method, a spray coating method, and a spin coating method.

13. An electronic unit including a display, the display comprising:
- a first region including first pixels configured of a single color;
- a second region including second pixels configured of a plurality of colors different from the single color;
- a first dividing wall separating the first region from the second region;
- a second dividing wall separating the second region from another first region, wherein a dividing wall is not provided between the plurality of colors in the second region;
- a lyophilic region between the plurality of colors in the second region;
- a hole injection-transport layer disposed on central portions of the upper surface of the lyophilic region between lower electrodes associated with the plurality of colors in the second region, wherein the hole injection-transport layer includes a hole injection layer and a hole transport layer;
- a light emitting layer including first and second layers, wherein the first layer of the light emitting layer is a common light emitting layer continuously disposed on surfaces of hole injection-transport layer in the second region between the first dividing wall and the second dividing wall, wherein the second layer of the light emitting layer is disposed on the common light emitting layer in the second region, and wherein the second layer of the light emitting layer is disposed on the hole injection-transport layer in the first region.

14. The electronic unit according to claim 13, wherein at least one of the first and second dividing walls are subjected to water-repellent treatment.

15. The electronic unit according to claim 13, wherein lyophilic regions are provided around the first pixels and the second pixels, and
shapes of the first and second pixels are determined by the lyophilic regions.

16. The electronic unit according to claim 13, wherein the second pixels each have a rectangular shape and are arranged in a line such that adjacent second pixels have colors different from each other, and
a longitudinal direction of the second pixels is arranged perpendicular to an extending direction of the dividing wall.

17. The electronic unit according to claim 13, wherein the second pixels are linearly arranged being separated by color along an extending direction of the dividing wall.

18. The electronic unit according to claim 13, wherein the first and second pixels each include a thin film transistor provided on a substrate and a display device having the light emitting layer provided on the thin film transistor, and
wherein the thicknesses of the light emitting layer in the second pixels are different for each of the plurality of colors due to a step in a planarizing film between the thin film transistor and the display device, the display device further including:
an electron injection-transport layer provided on the light emitting layer, the electron injection-transport layer being provided continuously on whole surfaces of the first and second regions, the electron injection-transport layer having electron injection characteristics or electron transport characteristics or both and the hole injection-transport layer having hole injection characteristics or hole transport characteristics or both; and
an upper electrode.

19. The display according to claim 1, further comprising:
lower electrodes arranged on a substrate corresponding to a red organic electroluminescent (EL) element, a green organic EL element, and a blue organic EL element, respectively,
wherein the first region includes at least one blue organic EL element and the second region includes at least one red organic EL element and at least one green organic EL element, and
wherein the first layer of the light emitting layer is a yellow light emitting layer and the second layer of the light emitting layer is a blue light emitting layer.

* * * * *